(12) United States Patent
Low

(10) Patent No.: US 8,125,091 B2
(45) Date of Patent: Feb. 28, 2012

(54) WIRE BONDING OVER ACTIVE CIRCUITS

(75) Inventor: Qwai H. Low, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 506 days.

(21) Appl. No.: 12/331,561

(22) Filed: Dec. 10, 2008

(65) Prior Publication Data

US 2009/0236742 A1   Sep. 24, 2009

Related U.S. Application Data

(60) Provisional application No. 61/069,925, filed on Mar. 18, 2008.

(51) Int. Cl.
*H01L 23/12* (2006.01)
*H01L 21/44* (2006.01)

(52) U.S. Cl. . 257/780; 257/737; 257/784; 257/E23.068; 257/E21.589; 438/612; 438/617

(58) Field of Classification Search .......... 257/734–786, 257/E23.01–E23.079, E23.141, E21.589, 257/772, 779; 438/612–617
See application file for complete search history.

(56) References Cited

U.S. PATENT DOCUMENTS

| 7,154,186 B2 * | 12/2006 | Noquil et al. | 257/778 |
| 2004/0072396 A1 * | 4/2004 | Tiziani et al. | 438/200 |

\* cited by examiner

*Primary Examiner* — Jasmine Clark

(57) ABSTRACT

A semiconductor device includes a semiconductor die mounted over a package substrate. The die has a bond pad located thereover. A stud bump consisting substantially of a first metal is located on the bond pad. A wire consisting substantially of a different second metal is bonded to the stud bump.

20 Claims, 3 Drawing Sheets

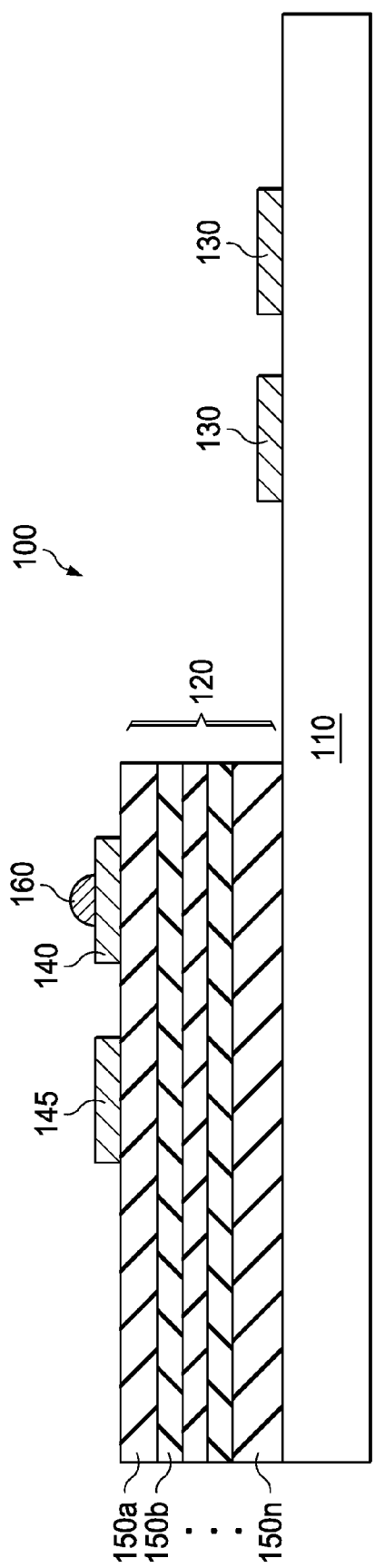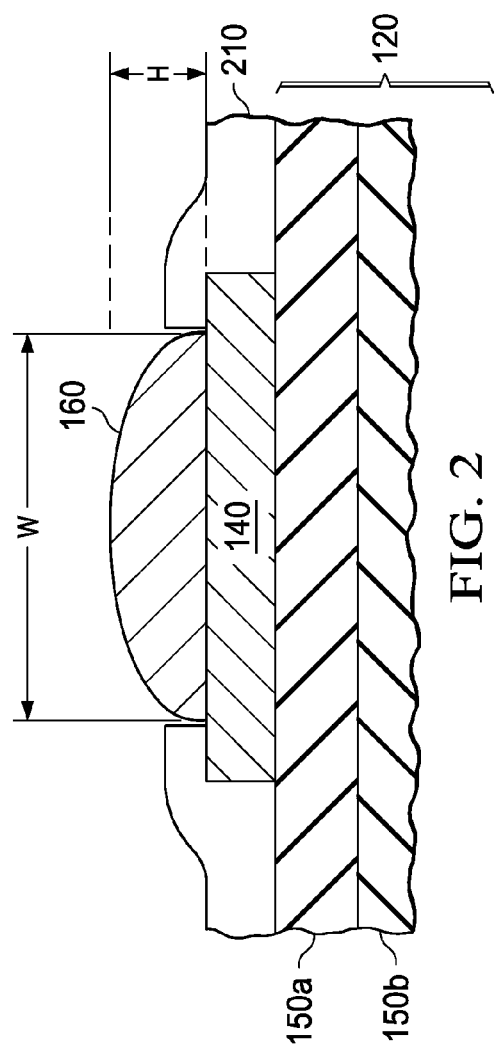
FIG. 1
FIG. 2

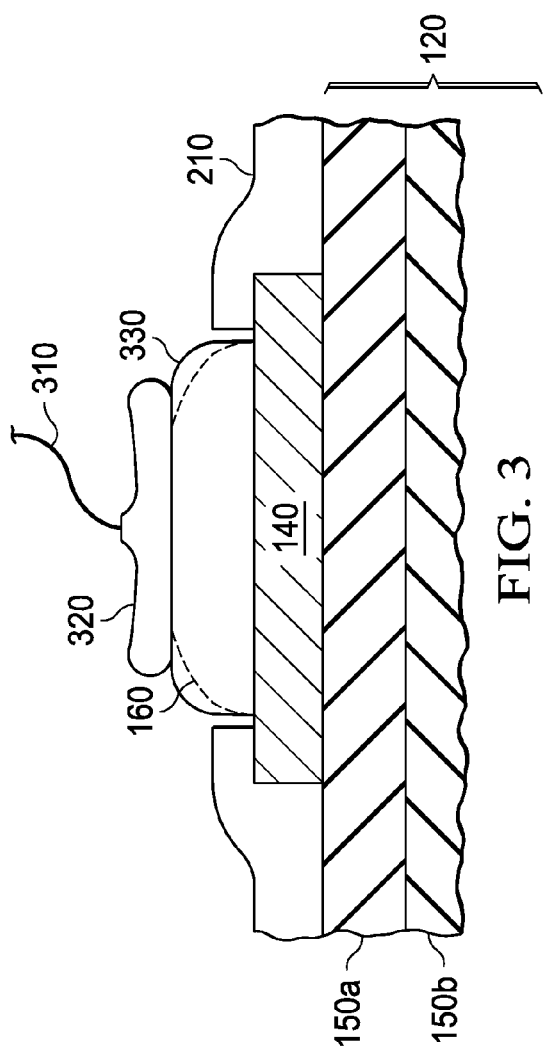
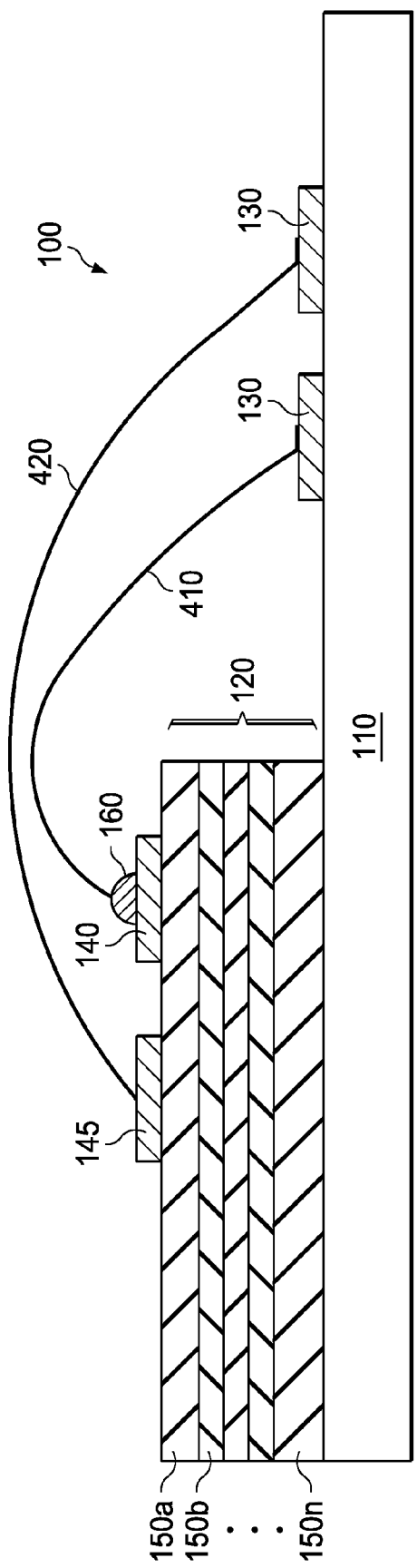
FIG. 3
FIG. 4

WIRE BONDING OVER ACTIVE CIRCUITS

CROSS-REFERENCE TO RELATED APPLICATION

This application claims the benefit of U.S. Provisional Application Ser. No. 61/069,925, filed by Qwai H. Low on Mar. 18, 2008 entitled "Copper Wire Bonding on Die Pads with Active Circuit under Pad," commonly assigned with this application and incorporated herein by reference.

TECHNICAL FIELD

This application is directed, in general, to semiconductor manufacturing, and, more specifically, to wire bonding.

BACKGROUND

An integrated circuit (IC) is typically connected to a package substrate using wire loops. The wire loops may be attached to a bond pad on the integrated circuit and a bond site on the substrate. Gold wire is often used for such connections, but may be prohibitively expensive or may have too great a resistivity in some applications. However, in some cases alternative materials may not be substituted simply for gold.

SUMMARY

One aspect provides a semiconductor device. The device includes a semiconductor die mounted over a package substrate. The die has a bond pad located thereover. A stud bump is located on the bond pad. The stud bump consists substantially of a first metal. A wire is bonded to the stud bump. The wire consists substantially of a different second metal.

Another aspect provides a method of manufacturing a semiconductor device. A semiconductor die over a package substrate is provided. The die has a bond pad formed thereover. A stud bump consisting substantially of a first metal is formed on the bond pad. A wire loop is bonded to the stud bump and to a bonding site on the package substrate. The wire loop consists substantially of a different second metal.

Another aspect provides a semiconductor device. The device includes an integrated circuit package having a substrate. A semiconductor die having a bond pad formed thereover is mounted over the substrate. A gold stud bump is bonded to the bond pad. A copper wire loop connects the stud bump to the gold stud bump and a bond site on the substrate.

BRIEF DESCRIPTION

Reference is now made to the following descriptions taken in conjunction with the accompanying drawings, in which:

FIGS. 1 and 4 illustrate a semiconductor die over a substrate at various stages of manufacture;

FIG. 2 illustrates a stud bump;

FIG. 3 illustrates a wire attached to a stud bump; and

DETAILED DESCRIPTION

Figure 5:
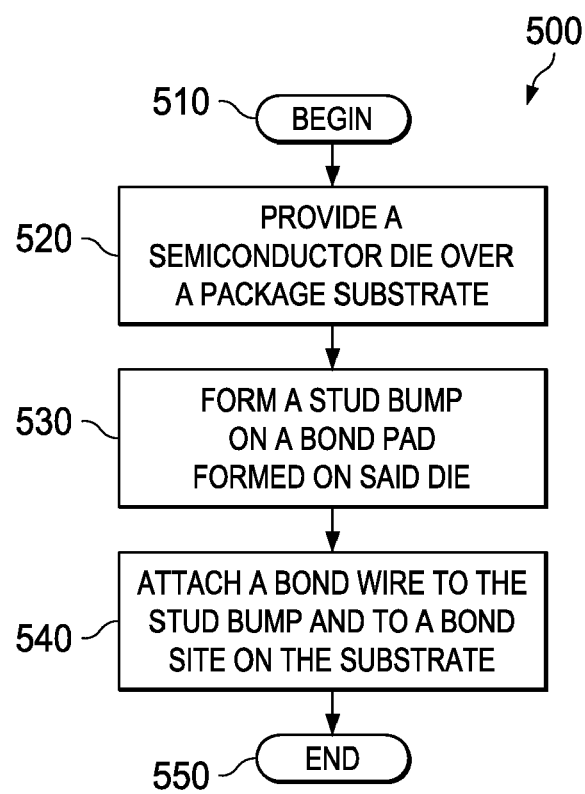
FIG. 5 illustrates a method, e.g. for manufacturing a semiconductor device.

A semiconductor device is typically attached to a package substrate in die form. The substrate provides mechanical support, environmental protection, and electrical connection to input and output terminals needed to operate with a larger system. Wire loops generally connect bond pads on the die to bond sites on the substrate. The wires may be, e.g., aluminum, copper, silver or gold. A wire bonding process using a wire bonding tool is typically used to form the connections.

Gold wire generally meets or exceeds relevant electrical and materials requirements for a wire bond process. For example, gold resists corrosion, has a low resistivity, and is highly ductile. However, the cost of gold makes its use undesirable in some applications, such as low cost consumer electronics. Moreover, while the resistivity of gold is low compared to, e.g., aluminum, gold has a resistivity about 25% greater than other alternatives, such as copper. In some cases, such as in high performance or high power applications, copper is preferred for its lower resistivity. However, while copper may have a desirable resistivity, it is harder, has a higher modulus, and is less ductile. Thus, more energy and/or pressure is typically needed in the wire bonding process to form a reliable connection to a bond pad.

In some cases, this greater energy and/or pressure may damage a semiconductor device. Many devices use low-k dielectrics for increased performance, and may use a circuit-under-pad (CUP) layout to reduce the size of the device die. Thus, the dielectric layers underlying a device bond pad may be too fragile to support the energy and pressure required to bond copper wire to the bond pad.

However, the disclosure reflects the recognition that the destructive potential of some wire bonding processes may be mitigated by the use of a buffer material with greater malleability or lower modulus than the wire used. Such a buffer material may distribute the energy and pressure of the bonding process over a larger area, thereby producing lower stress on underlying dielectric layers.

Turning first to FIG. 1, illustrated are aspects of a semiconductor device 100, including a package substrate 110 and a semiconductor die 120. The die 120 is attached to the substrate 110 by a suitable means, e.g., thermally cured epoxy. The substrate 110 includes bonding sites 130. The bonding sites may be, e.g., copper or gold pads or posts. The die 120 includes bond pads 140, 145. The bond pads 140, 145 may be any conventional bond pad, e.g., aluminum, aluminum-alloy or copper, and may include a finish layer such as nickel or palladium. Low-k dielectric layers and/or circuit layers 150a, 150b, . . . 150n (collectively referred to hereinafter as layers 150) may underlie the bond pad 140. One or more of these layers 150 may comprise a low-k dielectric material. Furthermore, one more layers 150 may comprise portions of an active circuit. An active circuit includes, e.g., interconnects and transistors, but does not include dummy structures designed to mechanically strengthen the layers 150.

A stud bump 160 is located over the bond pad 140. A stud bump is a raised metal portion formed on a bond pad of a semiconductor device. Stud bumps are conventionally used in flip-chip package applications, and may be formed without the need for under-bump metallization. The metallurgy of a stud bump is generally distinct from that of the underlying pad.

The stud bump 160 may be formed, e.g., by a modified ball-bonding process. A ball-bonding process may be a portion of a conventional semiconductor wire bonding process, in which the wire is cut at the neck of the ball after forming the ball. Ball-bonding may be done with, e.g., gold, copper, aluminum-alloy, palladium-alloy or platinum. A ball bonding process may also be configured to form a stud bump on a subset of bond pads less than the entire set of bond pads. In some cases, such selective stud bump formation may desirable for, e.g., cost reduction. A stud bump may alternatively be formed by electroplating, e.g. In some cases electroplating may provide a throughput advantage over ball-bonding techniques, as electroplating typically processes all bonds pads on a wafer simultaneously.

FIG. 2 illustrates the stud bump 160 and bond pad 140 in greater detail. The stud bump 160 consists substantially of a first metal. The stud bump 160 has a height H and a width W. The ratio H/W is referred to herein as the aspect ratio of the bump 160. A passivation overcoat (PO) 210 may be located over the die 120, and may partially cover the bond pad 140.

FIG. 3 illustrates the stud bump 160 detail after bonding a wire 310 to the stud bump 160. The stud bump 160 has been deformed to form a deformed stud bump 330. An outline of the stud bump 160 prior to wire bonding is illustrated for comparison. The bonding process forms a ball 320 over the deformed stud bump 330. The wire 310 and the ball 320 consist substantially of a different second metal. "Consists substantially" means that the wire 310 or the stud bump 160 comprises at least about 95% of a particular metallic element. Thus, e.g., a gold stud bump comprises at least about 95% gold. The balance of the composition of the stud bump 160 or the wire 310 may include alloying metals and/or a dopant selected to result in particular properties of the stud bump 160, the wire 310, or the bond formed therebetween.

The ball 320 is in metallurgical contact with the deformed stud bump 330. Thus, e.g., the ball 320 and the deformed stud bump 330 form an interfacial region that may include an alloy of the first and the second metal. In some cases, the interfacial region may form an intermetallic compound of the first and the second metal. Some intermetallic compounds may be undesirable due to, e.g., higher resistivity thereof compared to the uncompounded interface. In such cases, a dopant may be used in the stud bump 160 or the wire 310 selected to inhibit the formation of an intermetallic compound. For example, when gold is used for the stud bump 160 and copper is used for the wire 310 and the ball 320, palladium may be used to suppress the formation of a gold-copper intermetallic compound. It is believed that palladium reduces diffusion of gold by concentrating at grain boundaries of the gold. At a relatively low concentration, the palladium may suppress diffusion while having an insignificant affect on mechanical and electrical properties of the gold. In some cases, a concentration of palladium of about 1 wt. % or less provides the desired reduction of intermetallic formation without significantly degrading the properties of the deformed stud bump 330 or the interface with the ball 320.

When the ball 320 is formed, the ball-bonding process may use, e.g., pressure, heat and ultrasonic energy to effect a bond between the ball 320 and the underlying surface. Some of this pressure and energy is typically transferred to the layers 150 underlying the bond pad 140. If the energy and pressure exceed a critical value, two layers may delaminate, fracture, or be otherwise damaged, possibly leading to immediate failure of the device 100 or posing a long-term reliability risk.

Of particular concern is any low-k layer under the bond pad 140. As understood by those skilled in the pertinent art, a low-k layer may be a dielectric material with a dielectric constant lower than silicon dioxide. Nonlimiting examples include porous silica, carbon-doped silica, and polymers such as SiLK (trademark of Dow Chemical Company). Some low-k materials are more fragile than silicon dioxide, or may form an interface with an adjacent layer that is weaker than an interface silicon dioxide would form. Thus, the dielectric stack underlying the bond pad 140 that uses one or more low-k layers is generally weaker than a comparable stack using silicon dioxide.

The disclosure reflects the recognition that the risk of damage to the dielectric layers under the bond pad 140 may be significantly reduced by locating the stud bump 160 between the bond pad 140 and the ball 320. The stud bump 160 may cushion the bond pad 140 and the die 120 from the full impact of the wire bond process used to attach the wire 310. It is believed that when the stud bump is configured as disclosed herein, energy from the wire bond process is distributed over a larger area of the die 120 and/or partially dissipated by deformation of the stud bump 160. The combination of these effects is expected to significantly reduce the risk of delamination or fracture of the dielectric layers 150 of the die 120.

In one aspect, the second metal comprised by the wire 310 and the ball 320 may be harder than the first metal comprised by the stud bump 160. As used herein, hardness is the resistance of the metal to plastic deformation as determined by indentation. Hardness may be represented, e.g., by a Vickers value. As a nonlimiting example, the Vickers hardness of several metals used in wire bonding applications are tabulated in Table I.

In another aspect, the first metal has a lower Young's modulus than that of the second metal. The Young's modulus reflects, e.g., a metal's resistance to elastic deformation. It is thought that a factor involved in cushioning the dielectric layers 150 is the elastic deformation of the stud bump 160 during the process of forming the ball 320. In general, it is expected that a lower Young's modulus is associated with a greater cushioning effect.

TABLE I

|  | Vickers Hardness MPa | Young's Modulus GPa |
|---|---|---|
| Platinum (Pt) | 549 | 168 |
| Copper (Cu) | 369 | 110-128 |
| Silver (Ag) | 251 | 83 |
| Gold (Au) | 216 | 78 |

In another aspect, the first metal is more malleable than the second metal. One skilled in the pertinent art understands that malleability refers to the degree to which a metal may deform plastically under compressive stress. Malleability is a more subjective characteristic of a metal, but a generally accepted ordering of malleability of some metals used in wire bonding, is in descending order, Au>Ag>Al>Cu>Sn>Pt.

In some embodiments, the second metal, e.g., the wire 310, is harder than the first metal, e.g., the stud bump 160. In other embodiments, the first metal has a greater malleability than the second metal. In one aspect, the stud bump 160 may be formed with a profile conducive to deformation. For example, it is thought that when the stud bump has a higher aspect ratio H/W (FIG. 2), more energy may be dissipated in deformation processes, thereby cushioning the die 120. In some embodiments, the aspect ratio is at least about 0.5. In other embodiments, the aspect ratio is at least about 1.0.

Nonlimiting examples of combinations of the wire 310 and the stud bump 160 include: gold stud bump 160 and copper wire 310; gold stud bump 160 and platinum wire 310; silver stud bump 160 and copper wire 310; and silver stud bump 160 and platinum wire 310. While some combinations may result in greater packaging cost than a conventional wire bond design, such greater cost may be justified when, e.g., a high performance die 120 requires lower resistance of the wire 310. Those skilled in the pertinent art will recognize that other combinations consistent with the principles of the disclosure are possible and within the scope of the disclosure.

FIG. 4 illustrates the device 100 after forming a first wire loop 410 and a second wire loop 420. The first wire loop 410 connects the stud bump 160 to a bonding site 130. The second wire loop 420 connects the bond pad 145 directly to another bonding site 130 without an intermediate stud bump. The wire loops 410, 420 may be formed by a same or a different wire bonding process. In some cases, the metal used for the first wire loop 410 may be different than the metal used to form the second wire loop 420. Such may be the case, e.g., where critical wire bonds are formed as described herein, while non-critical wire bonds are formed by a conventional wire bond process to lower cost or increase packaging throughput.

Turning to FIG. 5, a method of the disclosure is illustrated. Elements of the previous Figures are referred to for illustration purposes without limitation in the following description. The method begins with a step 510. In a step 520, the semiconductor die 120 is provided that is over the package substrate 110. Herein, "provided" means that a device, substrate, structural element, etc., may be manufactured by the individual or business entity performing the disclosed methods, or obtained thereby from a source other than the individual or entity, including another individual or business entity.

In a step 530, the stud bump 160 is formed on a bond pad, e.g., the bond pad 140, located over the die 120. The stud bump 160 may be formed as described previously, e.g., by ball bonding or by electroplating. The metal used to form the stud pump may be essentially pure, or may be alloyed with another metal. The metal may further be any metal known to be usable in semiconductor wire bonding applications, including the aforementioned metals. The stud bump may be doped with an element selected to inhibit the formation of an intermetallic compound of the stud bump metal and a different wire metal bonded thereto in a later step.

In a step 540, a wire, e.g., the wire 310, is attached to the stud bump 160. The wire may be bonded to the stud bump 160 by a conventional ball bonding process tool. In general, the process parameters are expected to be specific to the tool and the combination of metals selected for the wire 310 and the stud bump 160. Those skilled in the art understand that a ball bonding process may be at least partially characterized by the force applied between a ball formed at the end of a bond wire and a bonding surface, and the time and temperature with which the force is applied. Moreover, a power may be dissipated at the bonding site or a current caused to flow through the wire during the bonding operation. The specific details of such processes may be determined by those skilled in the wire bonding art. In a nonlimiting example, a 20 μm copper wire may be bonded using a KNS wire bonder. A gold stud bump may act as the bonding surface. The wire bonder may be configured to apply a force in a range between about 10 g to about 20 g for a time period in a range between about 12 ms to about 20 ms. The temperature may be selected to be in a range between about 150 C and about 220 C. A current in a range between about 70 mA and about 110 mA may be applied by a USG current source.

In the step 540, the wire 310 is also attached to the bonding site 130 on the package substrate 110. The bonding process may be any conventional or later discovered process suitable to the metal used for the wire and the bonding site. The process 500 ends with a step 550.

Those skilled in the art to which this application relates will appreciate that other and further additions, deletions, substitutions and modifications may be made to the described embodiments.

What is claimed is:

1. A semiconductor device, comprising:
 a semiconductor die mounted over a package substrate and having a bond pad located thereover;
 a stud bump located on said bond pad, said stud bump consisting substantially of a first metal;
 a first wire bonded to said stud bump, said first wire consisting substantially of a different second metal; and
 a second wire bonded directly to a second bond pad located over said die.

2. The semiconductor device as recited in claim 1, wherein said second metal is harder than said first metal.

3. The semiconductor device as recited in claim 1, wherein said first metal is more malleable than said second metal.

4. The semiconductor device as recited in claim 1, wherein said stud bump comprises gold.

5. The semiconductor device as recited in claim 1, wherein said first wire comprises copper.

6. The semiconductor device as recited in claim 4, wherein said stud bump further comprises palladium.

7. The semiconductor device as recited in claim 1, further comprising a low-k dielectric layer or an active circuit under said bond pad.

8. A method of manufacturing a semiconductor device, comprising:
 providing a semiconductor die over a package substrate, said die having a bond pad formed thereover;
 forming a stud bump on said bond pad, said stud bump consisting substantially of a first metal;
 bonding a first end of a bond wire to said stud bump, said wire consisting substantially of a different second metal;
 bonding a second end of said bond wire to a bond site on said package substrate; and
 doping said stud bump or said wire with a dopant selected to inhibit intermetallic formation between said stud bump and said wire.

9. The method as recited in claim 8, wherein said first metal has a lower modulus than said second metal.

10. The method as recited in claim 8, wherein said first metal is more malleable than said second metal.

11. The method as recited in claim 8, wherein said stud bump is formed by a ball bonding process.

12. The method as recited in claim 8, wherein said semiconductor die comprises a low-k dielectric under said bond pad.

13. The method as recited in claim 8, wherein said stud bump comprises gold and said wire comprises copper.

14. A semiconductor device, comprising:
 an integrated circuit package having a substrate;
 a semiconductor die having first and second bond pads formed thereover and mounted over said substrate;
 a gold stud bump bonded to said first bond pad;
 a copper first wire connecting said gold stud bump and a bond site on said substrate; and
 a second wire connected directly to said second bond pad.

15. The semiconductor device recited in claim 14, wherein said gold stud bump is formed by a ball bonding process.

16. The semiconductor device recited in claim 14, wherein said gold stud bump comprises palladium.

17. A semiconductor device, comprising:
 a semiconductor die mounted over a package substrate and having a bond pad located thereover;
 a stud bump located on said bond pad, said stud bump consisting substantially of a first metal;
 a wire bonded to said stud bump, said wire consisting substantially of a different second metal; and
 a low-k dielectric layer located between said bond pad and said semiconductor die.

18. A semiconductor device, comprising:
 a semiconductor die mounted over a package substrate and having a bond pad located thereover;

a stud bump located on said bond pad, said stud bump consisting substantially of a first metal;

a wire bonded to said stud bump, said wire consisting substantially of a different second metal; and an active circuit located between said bond pad and said semiconductor die.

19. A method of manufacturing a semiconductor device, comprising:

providing a semiconductor die over a package substrate, said die having a bond pad formed thereover;

forming a stud bump on said bond pad, said stud bump consisting substantially of a first metal;

forming a low-k dielectric layer between said bond pad and said semiconductor die;

bonding a first end of a bond wire to said stud bump, said bond wire consisting substantially of a different second metal; and bonding a second end of said bond wire to a bond site on said package substrate.

20. A method of manufacturing a semiconductor device, comprising:

providing a semiconductor die over a package substrate, said die having a bond pad formed thereover;

forming a stud bump on said bond pad, said stud bump consisting substantially of a first metal;

forming an active circuit between said bond pad and said semiconductor die;

bonding a first end of a bond wire to said stud bump, said bond wire consisting substantially of a different second metal; and bonding a second end of said bond wire to a bond site on said package substrate.

* * * * *